United States Patent
Kohara et al.

(10) Patent No.: US 10,328,674 B2
(45) Date of Patent: Jun. 25, 2019

(54) LAMINATED GLASS

(71) Applicant: ZEON CORPORATION, Chiyoda-ku, Tokyo (JP)

(72) Inventors: Teiji Kohara, Tokyo (JP); Daido Chiba, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/322,137

(22) PCT Filed: Jul. 7, 2015

(86) PCT No.: PCT/JP2015/069543
§ 371 (c)(1),
(2) Date: Dec. 26, 2016

(87) PCT Pub. No.: WO2016/006610
PCT Pub. Date: Jan. 14, 2016

(65) Prior Publication Data
US 2017/0151757 A1 Jun. 1, 2017

(30) Foreign Application Priority Data

Jul. 9, 2014 (JP) ................................. 2014-141535
Feb. 26, 2015 (JP) ................................. 2015-037438

(51) Int. Cl.
| | | |
|---|---|---|
| *B32B 3/00* | (2006.01) | |
| *B32B 17/10* | (2006.01) | |
| *C08C 19/25* | (2006.01) | |
| *C23C 14/08* | (2006.01) | |
| *C23C 14/18* | (2006.01) | |
| *C23C 14/35* | (2006.01) | |
| *E06B 3/67* | (2006.01) | |

(52) U.S. Cl.
CPC .. *B32B 17/10229* (2013.01); *B32B 17/10036* (2013.01); *B32B 17/10779* (2013.01); *B32B 17/10853* (2013.01); *B32B 17/10871* (2013.01); *C08C 19/25* (2013.01); *C23C 14/086* (2013.01); *C23C 14/185* (2013.01); *C23C 14/35* (2013.01); *E06B 3/6715* (2013.01); *B32B 2255/10* (2013.01); *B32B 2255/205* (2013.01); *B32B 2307/416* (2013.01); *B32B 2309/02* (2013.01); *B32B 2309/12* (2013.01); *B32B 2309/68* (2013.01); *B32B 2311/00* (2013.01); *B32B 2315/08* (2013.01); *B32B 2367/00* (2013.01); *B32B 2386/00* (2013.01); *B32B 2419/00* (2013.01); *B32B 2605/08* (2013.01)

(58) Field of Classification Search
CPC ........ B32B 17/10036; B32B 17/10229; B32B 17/10779; B32B 17/10853; B32B 17/10871; B32B 2255/10; B32B 2255/205; B32B 2307/416; B32B 2309/02; B32B 2309/12; B32B 2309/68; B32B 2311/00; B32B 2315/08; B32B 2367/00; B32B 2386/00; B32B 2419/00; B32B 2605/08; C08C 19/25; C23C 14/086; C23C 14/185; C23C 14/35; E06B 3/6715

See application file for complete search history.

(56) References Cited

U.S. PATENT DOCUMENTS

| | | | |
|---|---|---|---|
| 3,893,234 A * | 7/1975 | Levin | ..................... B32B 17/10 29/825 |
| 4,368,945 A | 1/1983 | Fujimori et al. | |
| 5,270,518 A * | 12/1993 | Naoumenko | ..... B32B 17/10036 219/203 |
| 6,042,924 A * | 3/2000 | Paulus | .............. B32B 17/10036 428/131 |
| 6,174,592 B1 | 1/2001 | Sperger et al. | |

(Continued)

FOREIGN PATENT DOCUMENTS

| | | |
|---|---|---|
| EP | 0322166 A1 | 6/1989 |
| EP | 2532692 A1 | 12/2012 |

(Continued)

OTHER PUBLICATIONS

WO 2012043708 A1 Machine Translation.*
Oct. 6, 2015, International Search Report issued in the International Patent Application No. PCT/JP2015/069543.
Jan. 10, 2017, International Preliminary Report on Patentability issued in the International Patent Application No. PCT/JP2015/069543.
Feb. 23, 2018, Extended European Search Report issued by the European Patent Office in the corresponding European Patent Application No. 15819174.2.

*Primary Examiner* — Travis M Figg
(74) *Attorney, Agent, or Firm* — Kenja IP Law PC

(57) ABSTRACT

Provided is a laminated glass including, in order: a first glass sheet; a first interlayer film; a transparent film laminated with a heat reflection film; a second interlayer film; and a second glass sheet, wherein the first interlayer film and the second interlayer film are formed of a modified hydrogenated block copolymer [E], the modified hydrogenated block copolymer [E] is a hydrogenated block copolymer [D] in which an alkoxysilyl group is incorporated, the hydrogenated block copolymer [D] being a block copolymer [C] in which 90% or more of all unsaturated bonds is hydrogenated, the block copolymer [C] is composed of at least two polymer blocks [A] including a repeat unit derived from an aromatic vinyl compound, and at least one polymer block [B] including a repeat unit derived from a linear conjugated diene compound, and the ratio of weight fraction [A]:[B] is 30:70 to 60:40.

2 Claims, No Drawings

(56) References Cited

U.S. PATENT DOCUMENTS

| | | | |
|---|---|---|---|
| 6,352,754 B1* | 3/2002 | Frost | B32B 17/10 |
| | | | 428/138 |
| 6,538,192 B1* | 3/2003 | Coster | B32B 17/10036 |
| | | | 136/251 |
| 2003/0143371 A1* | 7/2003 | Conway | B32B 17/10 |
| | | | 428/136 |
| 2003/0150848 A1* | 8/2003 | Noguchi | B32B 17/10036 |
| | | | 219/203 |
| 2004/0176514 A1* | 9/2004 | Kubo | C08K 3/22 |
| | | | 524/431 |
| 2009/0166347 A1* | 7/2009 | Blanchard | B32B 17/10036 |
| | | | 219/201 |
| 2010/0285280 A1* | 11/2010 | Yonekura | B32B 17/10 |
| | | | 428/174 |
| 2013/0008506 A1* | 1/2013 | Tanahashi | C08L 53/025 |
| | | | 136/259 |
| 2013/0244367 A1* | 9/2013 | Kohara | C08F 287/00 |
| | | | 438/64 |
| 2015/0104654 A1* | 4/2015 | Kohara | C08F 8/42 |
| | | | 428/429 |

FOREIGN PATENT DOCUMENTS

| | | | | |
|---|---|---|---|---|
| EP | 2623526 A1 | 8/2013 | | |
| JP | S5632352 A | 4/1981 | | |
| JP | S5733194 U | 2/1982 | | |
| JP | S58140137 U | 9/1983 | | |
| JP | S6021834 A | 2/1985 | | |
| JP | S63134232 A | 6/1988 | | |
| JP | S63179953 A | 7/1988 | | |
| JP | H01168643 A | 7/1989 | | |
| JP | H06144891 A | 5/1994 | | |
| JP | H07157344 A | 6/1995 | | |
| JP | 2000007389 A | 1/2000 | | |
| JP | 2000086308 A | 3/2000 | | |
| JP | 2005514233 A | 5/2005 | | |
| JP | 2008303084 A | 12/2008 | | |
| WO | 2003057479 A2 | 7/2003 | | |
| WO | 2009087869 A1 | 7/2009 | | |
| WO | WO-2009087869 A1 * | 7/2009 | | B32B 17/10 |
| WO | 2011096389 A1 | 8/2011 | | |
| WO | 2012043708 A1 | 4/2012 | | |
| WO | WO-2012043708 A1 * | 4/2012 | | C08F 8/04 |
| WO | 2013176258 A1 | 11/2013 | | |
| WO | WO-2013176258 A1 * | 11/2013 | | C08F 8/42 |

* cited by examiner

LAMINATED GLASS

TECHNICAL FIELD

This disclosure relates to a laminated glass that includes, in order, a glass sheet, an interlayer film, a heat reflection film, an interlayer film and a glass sheet, wherein the interlayer films are made of specific material allowing the laminated glass to exhibit superior moisture resistance and durability.

BACKGROUND

Laminated glasses with heat reflection function are useful as window glass for automotives and buildings and other purposes for their ability to block the incident heat radiation for enhanced air conditioning performance during summer time as well as for effective energy saving (PTLS 1 to 3).

Laminated glasses with heat reflection function come in two forms: those having a heat reflection film laminated onto glass; and those in which a transparent film laminated with a heat reflection film is sandwiched between glass sheets. The latter type of laminated glass is superior in mass-productivity in that a transparent film laminated with a heat reflection film can be continuously produced and is therefore industrially advantageous.

However, the conventional laminated glass in which a transparent film laminated with a heat reflection film is sandwiched between glass sheets is inferior in durability because when it is subjected to a durability test in the environment of 50° C. and 95% RH, a condition which is required for safety glass for automotives, the laminated glass undergoes color changes and/or the transparent film laminated with a heat reflection film shows clouding occurring from the edge of the laminated glass.

To solve this problem, PTL 3 discloses a laminated glass in which the entire edge of the laminated glass is enclosed by sealing materials.

The laminated glass disclosed in this literature, however, has the problem that while it is applicable to window designed to be affixed to frames, the thickness of the sealing material is small enough to result in failure to attain a moisture exclusion effect in applications where the glass sheets themselves move down and up as in automobile windows.

PTL 4 discloses a heat reflection laminated glass that includes glass having a film-free area around the glass edge, which is obtained by depositing a heat resistant film at a position set back from the glass edge. PTL 5 discloses a laminated glass wherein the edge of a film laminated with a heat reflection film is set back inwardly from the edge of the glass sheet so that a region free of the film laminated with a heat reflection film is provided around the glass edge.

However, the laminated glasses disclosed in these literatures include highly moisture absorbing or permeable interlayer films, such as polyvinyl butyral films, ethylene/vinyl acetate copolymer films or polyurethane films, for manufacture of the laminated glass. Accordingly, these laminated glasses are susceptible to clouding at the peripheral portion due to water penetration from the glass edge in more stringent high-temperature, high-humidity environments or during long-term usage, and therefore, do not necessarily have sufficient durability.

On the other hand, PTL 6 proposes laminated glass that includes an interlayer film made of a modified hydrogenated block copolymer in which an alkoxysilyl group is incorporated into a specific hydrogenated block copolymer. PTL 6 mentions that the interlayer film is superior in heat resistance and low moisture absorption and thus can retain strong adhesion to glass even after exposed to high-temperature, high-humidity environments, and that heat reflection glass can be used.

However, this literature is silent with regard to sealing of a film laminated with a heat reflection film and a method of sealing.

CITATION LIST

Patent Literature

PTL 1: JPS5632352A
PTL 2: JPS63134232A
PTL 3: JPH07157344A
PTL 4: JP2000007389A
PTL 5: WO2009087869A (US20100285280A1)
PTL 6: WO2013176258A (US20150104654A1)

SUMMARY

Technical Problem

This disclosure was made in consideration of the circumstances pertinent in the art. It would therefore be helpful to provide a laminated glass that has superior characteristics also in practical use by solving the problems pertinent in the conventional laminated glass having a heat reflection function, i.e., problems in moisture resistance and durability.

Solution to Problem

As a result of extensive studies made by the inventors to attain the aforementioned objective, they established that a laminated glass that includes, in order, a first glass sheet, a first interlayer film, a transparent film laminated a heat reflection film, a second interlayer film, and a second glass sheet wherein the first and second interlayer films are formed of a modified hydrogenated block copolymer [E] in which an alkoxysilyl group is incorporated into a specific hydrogenated block copolymer [D] has a superior heat reflection function as well as superior moisture resistance and durability. The inventors thus completed this disclosure.

According to this disclosure, there is provided laminated glasses given in the following items (1) and (2).

(1) A laminated glass including, in order:
  a first glass sheet;
  a first interlayer film;
  a transparent film laminated with a heat reflection film;
  a second interlayer film; and
  a second glass sheet, wherein
  the first interlayer film and the second interlayer film are both formed of a modified hydrogenated block copolymer [E],
  the modified hydrogenated block copolymer [E] is a hydrogenated block copolymer [D] in which an alkoxysilyl group is incorporated, the hydrogenated block copolymer [D] being a block copolymer [C] in which 90% or more of all unsaturated bonds is hydrogenated,
  the block copolymer [C] is composed of at least two polymer blocks [A] and at least one polymer block [B], the polymer blocks [A] each including a repeat unit derived from an aromatic vinyl compound as a main component, and the polymer block [B] including a repeat unit derived from a linear conjugated diene compound as a main component, and a wA-to-wB ratio (wA:wB) is 30:70 to 60:40, where wA is a weight fraction of all the polymer blocks [A] of the block copolymer, and wB is a weight fraction of all the polymer blocks [B] of the block copolymer.
(2) A laminated glass including, in order:
a first glass sheet;
a first interlayer film;
a transparent film laminated with a heat reflection film;
a second interlayer film; and
a second glass sheet, wherein
the first interlayer film and the second interlayer film are both formed of a modified hydrogenated block copolymer [E],
the modified hydrogenated block copolymer [E] is a hydrogenated block copolymer [D] in which an alkoxysilyl group is incorporated, the hydrogenated block copolymer [D] being a block copolymer [C] in which 90% or more of all unsaturated bonds is hydrogenated,
the block copolymer [C] is composed of at least two polymer blocks [A] and at least one polymer block [B], the polymer blocks [A] each including a repeat unit derived from an aromatic vinyl compound as a main component, and the polymer block [B] including a repeat unit derived from a linear conjugated diene compound as a main component,
a wA-to-wB ratio (wA:wB) is 30:70 to 60:40, where wA is a weight fraction of all the polymer blocks [A] of the block copolymer, and wB is a weight fraction of all the polymer blocks [B] of the block copolymer,
a. the transparent film laminated with the heat reflection film has a smaller area than the first and second glass sheets,
b. the transparent film laminated with the heat reflection film has a smaller area than the first and second interlayer films,
c. an entire perimeter edge of the transparent film laminated with the heat reflection film is set back 2 mm or more from an edge of the first and second glass sheets,
d. the entire perimeter edge of the transparent film laminated with the heat reflection film is set back 2 mm or more from an edge of the first and second interlayer films, and
e. the transparent film laminated with the heat reflection film is embedded by the first and second interlayer films.

Advantageous Effect of Invention

According to this disclosure, there is provided laminated glass having superior heat reflection function as well as superior moisture resistance and durability.

DETAILED DESCRIPTION

The laminated glass disclosed herein includes a first glass sheet; a first interlayer film; a transparent film laminated with a heat reflection film; a second interlayer film; and a second glass sheet, which are laminated in the order presented, wherein the first and second interlayer films are formed of a specific modified hydrogenated block copolymer [E].

1. Modified Hydrogenated Block Copolymer [E]

The modified hydrogenated block copolymer [E] used in this disclosure is a copolymer obtained by incorporating an alkoxysilyl group to precursor hydrogenated block copolymer [D].

The hydrogenated block copolymer [D] is obtained by hydrogenating 90% or more of all unsaturated bonds of its precursor block copolymer [C].

The block copolymer [C] is a precursor of the block copolymer [D], and is a polymer containing at least two polymer blocks [A] and at least one polymer block [B].

Polymer Block [A]

The polymer block [A] is a polymer block that includes a structural unit derived from an aromatic vinyl compound as the main component.

The content of a structural unit derived from an aromatic vinyl compound in the polymer block [A] is normally 90% by weight or more, preferably 95% by weight or more, and more preferably 99% by weight or more.

When the content of a structural unit derived from an aromatic vinyl compound in the polymer block [A] is too small, there is concern that the first and/or second interlayer film(s) may have reduced heat resistance.

The polymer block [A] may include component(s) other than the structural unit derived from an aromatic vinyl compound. Examples of such additional components include structural units derived from linear conjugated dienes and/or structural units derived from other vinyl compounds. The content of the additional components is normally 10% by weight or less, preferably 5% by weight or less, and more preferably 1% by weight or less, relative to the polymer block [A].

Polymer blocks [A] of the block copolymer [C] may be the same or different so long as the polymer block [A] content satisfies any of the ranges described above.

Polymer Block [B]

The polymer block [B] is a polymer block including a structural unit derived from a linear conjugated diene compound as the main component.

The content of a structural unit derived from a linear conjugated diene compound in the polymer block [B] is normally 70% by weight or more, preferably 80% by weight or more, and more preferably 90% by weight or more. When the content of a structural unit derived from a linear conjugated diene compound in the polymer block [B] falls within any of the ranges described above, the first and/or second interlayer film(s) are advantageously provided with flexibility.

The polymer block [B] may include component(s) other than the structural unit derived from a linear conjugated diene compound. Examples of such additional components include structural units derived from aromatic vinyl compounds and/or structural units derived from other vinyl compounds. The content of the additional components is normally 30% by weight or less, preferably 20% by weight or less, and more preferably 10% by weight or less, relative to the polymer block [B]. When the content of a structural unit derived from an aromatic vinyl compound in the polymer block [B] is too large, there is concern that the first and/or second interlayer film(s) have reduced flexibility at low temperatures.

When the block copolymer [C] includes more than one polymer block [B], the polymer blocks [B] may be the same or different.

Examples of aromatic vinyl compounds include styrene; styrenes having a C1-C6 alkyl group as a substituent, such as α-methylstyrene, 2-methylstyrene, 3-methylstyrene, 4-methylstyrene, 2,4-diisopropylstyrene, 2,4-dimethylstyrene, 4-t-butylstyrene, and 5-t-butyl-2-methylstyrene; styrenes having a halogen atom as a substituent, such as 4-chlorostyrene, dichlorostyrene, and 4-monofluorostyrene; styrenes having a C1-C6 alkoxy group as a substituent, such as 4-methoxystyrene; styrenes having an aryl group as a substituent, such as 4-phenylstyrene; and vinylnaphthalenes such as 1-vinylnaphthalene, and 2-vinylnaphthalene. Of these compounds, preferred are polar group-free aromatic vinyl compounds such as styrene and styrenes having a C1-C6 alkyl group as a substituent, with styrene being particularly preferred because of its industrial availability.

Examples of linear conjugated diene compounds include 1,3-butadiene, isoprene, 2,3-dimethyl-1,3-butadiene, and 1,3-pentadiene, with polar group-free linear conjugated diene compounds being preferred from the perspective of moisture absorbency, and 1,3-butadiene and isoprene being particularly preferred because of their industrial availability.

Examples of other vinyl compounds include linear vinyl compounds, cyclic vinyl compounds, unsaturated cyclic acid anhydrides, and unsaturated imide compounds. These compounds may have substituent(s) such as nitrile group, alkoxycarbonyl group, hydroxycarbonyl group, and/or halogen atoms. Of these vinyl compounds, preferred are polar group-free vinyl compounds such as C2-C20 linear olefins such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; and C5-C20 cyclic olefins such as vinylcyclohexane from the perspective of moisture absorbency, with C2-C20 linear olefins being more preferred, and ethylene and propylene being particularly preferred.

Block Copolymer [C]

The block copolymer [C] is a precursor of the hydrogenated block copolymer [D], and is a polymer including at least two polymer blocks [A] and at least one polymer block [B].

The number of polymer blocks [A] in the block copolymer [C] is normally 5 or less, preferably 4 or less, and more preferably 3 or less.

When the block copolymer [C] includes more than one polymer block [A] and/or polymer block [B], the ratio of Mw(A)max, which is a weight-average molecular weight of the polymer block whose weight-average molecular weight is maximum in the polymer block [A], to Mw(A)min, which is a weight-average molecule weight of the polymer block whose average-molecular weight is minimum in the polymer block [A], i.e., Mw(A)max/Mw(A)min, and the ratio of Mw(B)max, which is a weight-average molecular weight of the polymer block whose weight-average molecular weight is maximum in the polymer block [B], to Mw(B)min, which is an average-molecular weight of the polymer block whose weight-average molecular weight is minimum in the polymer block [B], i.e., Mw(B)max/Mw(B)min, are both 4.0 or less, preferably 3.5 or less, and more preferably 3.0 or less.

When Mw(A) max is large or when Mw(B)min is so small that two polymer blocks [A] flanking one polymer block [B] having weight-average molecular weight of Mw(B)min behave as if they are a single polymer block [A], there is concern that the modulus of elasticity increases resulting in the interlayer films having reduced flexibility.

The block copolymer [C] can have any block form and may be a linear block or a radial block. The block form of block copolymer [C] is preferably a linear block because of superior mechanical strength. Particularly preferred forms of the block copolymer [C] are a triblock copolymer ([A]-[B]-[A]) having polymer blocks [A] bound to both ends of a block polymer [B], and a pentablock copolymer ([A]-[B]-[A]-[B]-[A]) having polymer blocks [B] bound to both ends of a polymer block [A] and further having polymer blocks [A] bound to ends of the respective polymer blocks [B].

In the block copolymer [C], wA-to-wB ratio (wA:wB) is 30:70 to 60:40, preferably 35:65 to 55:45, and more preferably 40:60 to 50:50, where wA is the weight fraction of all the polymer blocks [A] of the block copolymer, and wB is the weight fraction of all the polymer blocks [B] of the block copolymer. If the value of wA is too high, the first and/or second interlayer film(s) disclosed herein have high heat resistance but low flexibility, resulting in glass being susceptible to breakage by low-temperature thermal impact. On the other hand, if the value of wA is too low, the first and/or second interlayer film(s) tend to have reduced heat resistance.

The polystyrene equivalent weight-average molecular weight (Mw) of the block copolymer [C] as measured by gel permeation chromatography (GPC) using tetrahydrofuran (THF) as solvent is normally 40,000 to 200,000, preferably 50,000 to 150,000, more preferably 60,000 to 100,000.

The molecular weight distribution (Mw/Mn) of the block copolymer [C] is preferably 3 or less, more preferably 2 or less, and particularly preferably 1.5 or less.

The block copolymer [C] can be produced by any of the methods known in the art. For example, the block copolymer [C] can be produced by methods wherein a monomer mixture (a) containing an aromatic vinyl compound as the main component (where the content of the aromatic vinyl compound is normally 90% by weight or more, preferably 95% by weight or more, and more preferably 99% by weight or more; the same applies hereinafter), and a monomer mixture (b) containing a linear conjugated diene compound as the main component (where the content of the linear conjugated diene compound is normally 70% by weight or more, preferably 80% by weight or more, and more preferably 90% by weight or more; the same applies hereinafter) are alternatively polymerized by living anionic polymerization or other polymerization methods; methods wherein a monomer mixture (a) containing an aromatic vinyl compound as the main component and a monomer mixture (b) containing a linear conjugated diene compound as the main component are sequentially polymerized followed by coupling of the ends of polymer blocks [B] by coupling agents; and so forth.

Examples of coupling agents used for the latter method include halogen compounds such as methyldichlorosilane, dimethyldichlorosilane, methyltrichlorosilane, butyltrichlorosilane, tetrachlorosilane, dibromoethane, tin tetrachloride, tin butyltrichloride, germanium tetrachloride, and bis(trichlorosilyl)ethane; epoxy compounds such as epoxidized soybean oil; diester compounds of dicarboxylic acids, such as diethyl adipate, dimethyl adipate, dimethyl terephthalate, and diethyl terephthalate; polyvinyl compounds such as divinyl benzene; and polyisocyanates.

Hydrogenated Block Copolymer [D]

The hydrogenated block copolymer [D] is a hydrogenated product of the block copolymer [C] wherein all the unsaturated bonds of the block copolymer [C] described above, i.e., carbon-carbon unsaturated bonds of the main chain and side chains, and carbon-carbon unsaturated bonds of the aromatic rings of the block copolymer [C] are hydrogenated. The percent hydrogenation is normally 90% or more, preferably 97% or more, and more preferably 99% or more.

Weather resistance, heat resistance and transparency of a shaped article increase with increasing percent hydrogenation.

The percent hydrogenation of the hydrogenated block copolymer [D] can be found by measuring a $^1$H-NMR spectrum of the hydrogenated block copolymer [D].

Any method, reaction scheme and the like can be used for hydrogenation of unsaturated bonds. Hydrogenation may be achieved according to any of the methods known in the art. It is however preferable to employ hydrogenation methods which provide high values of percent hydrogenation and involve less polymer chain cleavage reactions. Examples of such hydrogenation methods are described for example in WO2011096389A and WO2012043708A.

After the completion of the hydrogenation reaction, the hydrogenated block copolymer [D] can be recovered from the resultant solution after removal of hydrogenation catalyst, or hydrogenation catalyst and polymerization catalyst. The recovered hydrogenated block copolymer [D] may take any form; it can be normally pelletized for subsequent reaction for incorporating an alkoxysilyl group.

The polystyrene equivalent weight-average molecular weight (Mw) of the hydrogenated block copolymer [D] as measured by gel permeation chromatography (GPC) using tetrahydrofuran (THF) as solvent is normally 40,000 to 200,000, preferably 50,000 to 150,000, and more preferably 60,000 to 100,000. The molecular weight distribution (Mw/Mn) of the hydrogenated block copolymer [D] is preferably 3 or less, more preferably 2 or less, and particularly preferably 1.5 or less. When Mw and Mw/Mn are adjusted to fall within the respective ranges described above, the interlayer films have good heat resistance and mechanical strength.

Modified Hydrogenated Block Copolymer [E]

The modified hydrogenated block copolymer [E] used in this disclosure is the hydrogenated block copolymer [D] described above wherein an alkoxysilyl group is incorporated.

Examples of alkoxysilyl groups include tri(C1-C6 alkoxy)silyl groups such as trimethoxysilyl group and triethoxysilyl group; (C1-C20 alkyl)di(C1-C6 alkoxy)silyl groups such as methyldimethoxysilyl group, methyldiethoxysilyl group, ethyldimethoxysilyl group, ethyldiethoxysilyl group, propyldimethoxysilyl group, and propyldiethoxysilyl group; and (aryl)di(C1-C6 alkoxy)silyl groups such as phenyldimethoxysilyl group, and phenyldiethoxysilyl group. Alkoxysilyl groups may be bound to the hydrogenated block copolymer [D] via divalent organic groups such as C1-C20 alkylene groups and/or C2-C20 alkyleneoxycarbonylalkylene groups.

The amount of alkoxysilyl groups incorporated into the hydrogenated block copolymer [D] is normally 0.1 parts by weight to 10 parts by weight, preferably 0.2 parts by weight to 5 parts by weight, and more preferably 0.3 parts by weight to 3 parts by weight, per 100 parts by weight of the hydrogenated block copolymer [D]. When the amount of incorporated alkoxysilyl groups is too large, it become more likely that problems such as reduced sheet formability occur due to gelling or reduced flowability of the resultant modified hydrogenated block copolymer [E] when molten, as the cross-linking of alkoxysilyl groups decomposed by trace amounts of water or the like promotes before it is molten and formed into a desired shape. On the other hand, when the amount of incorporated alkoxysilyl groups is too small, it becomes more likely that troubles occur such as failure to obtain adhesion high enough for bonding the interlayer films to glass sheets. Incorporation of alkoxysilyl groups can be confirmed by IR spectroscopy. The amount of incorporated alkoxysilyl groups can be calculated from a $^1$H-NMR spectrum.

The modified hydrogenated block copolymer [E] can be produced by any method. Production methods wherein alkoxysilyl groups are incorporated by reacting the hydrogenated block copolymer [D] described above with ethylenically unsaturated silane compounds under the presence of organic peroxides are preferable.

Any ethylenically unsaturated silane compound can be used so long as it undergoes graft polymerization with the hydrogenated block copolymer [D] to incorporate alkoxysilyl groups into the hydrogenated block copolymer [D]. Examples of ethylenically unsaturated silane compounds suitably used include vinyltrialkoxysilanes such as vinyltrimethoxysilane and vinyltriethoxysilane; dialkoxyalkylvinylsilanes such as dimethoxymethylvinylsilane and diethoxymethylvinylsilane; allyltrialkoxysilanes such as allyltrimethoxysilane and allyltriethoxysilane; styryltrialkoxysilanes such as p-styryltrimethoxysilane; (meth)acryloxytrialkoxysilanes such as 3-acryloxypropyltrimethoxysilane, 3-acryloxypropyltriethoxysilane, 3-methacryloxypropyltrimethoxysilane, and 3-methacryloxypropyltriethoxysilane; and (meth)acryloxyalkyldialkoxysilanes such as 3-methacryloxypropylmethyldimethoxysilane, and 3-methacryloxypropylmethyldiethoxysilane. As used herein, "(meth)acryloxy" refers to acryloxy or methacryloxy.

These ethylenically unsaturated silane compounds may be used alone or in combination.

The amount of ethylenically unsaturated silane compounds used is normally 0.1 parts by weight to 10 parts by weight, preferably 0.2 parts by weight to 5 parts by weight, and more preferably 0.3 parts by weight to 3 parts by weight, per 100 parts by weight of the hydrogenated block copolymer [D].

Peroxides having a half life temperature for 1 minute of 170° C. to 190° C. are advantageously used. Examples of peroxides suitably used include t-butylcumyl peroxide, dicumyl peroxide, di-t-hexyl peroxide, 2,5-dimethyl-2,5-di(t-butylperoxy)hexane, di-t-butyl peroxide, and di(2-t-butylperoxyisopropyl)benzene.

These peroxides may be used alone or in combination.

The amount of peroxides used is normally 0.05 parts by weight to 2 parts by weight, preferably 0.1 parts by weight to 1 part by weight, and more preferably 0.2 parts by weight to 0.5 parts by weight, per 100 parts by weight of the hydrogenated block copolymer [D].

Any method can be used for reacting the hydrogenated block copolymer [D] with ethylenically unsaturated silane compounds in the presence of peroxides. For example, alkoxysilyl groups can be incorporated into the hydrogenated block copolymer [D] by means of kneading at a desired temperature for a desired period of time using a twin-screw kneader. Kneading temperature by means of a twin-screw kneader is normally 180° C. to 220° C., preferably 185° C. to 210° C., and more preferably 190° C. to 200° C. Kneading time under heating is normally on the order of 0.1 minutes to 10 minutes, preferably 0.2 minutes to 5 minutes, and more preferably 0.3 minutes to 2 minutes. The material may be continuously kneaded and extruded with the kneading temperature and residence time set to fall within the above described ranges.

The molecular weight of the modified hydrogenated block copolymer [E] is substantially the same as the molecular weight of the hydrogenated block copolymer [D] from which it is made because the amount of alkoxysilyl groups incorporated is small. On the other hand, because the hydrogenated block copolymer [D] is reacted with ethylenically unsaturated silane compounds in the presence of peroxides, cross-linking reactions and cleavage reactions of the polymer take place simultaneously resulting in higher values of the molecular weight distribution of the modified hydrogenated block copolymer [E].

The polystyrene equivalent weight-average molecular weight (Mw) of the modified hydrogenated block copolymer [E] as measured by gel permeation chromatography (GPC) using tetrahydrofuran (THF) as solvent is normally 40,000 to 200,000, preferably 50,000 to 150,000, and more preferably 60,000 to 100,000. The molecular weight distribution (Mw/Mn) is preferably 3.5 or less, more preferably 2.5 or less, and particularly preferably 2.0 or less. When Mw and Mw/Mn are adjusted to fall within the respective ranges described above, heat resistance and mechanical strength of the interlayer films used herein are maintained.

Blending Agents

In this disclosure, the modified hydrogenated block copolymer [E] can be formulated as resin compositions blended with various blending agents which are generally blended into resins. Examples of preferred blending agents include softening agents and tackifiers for adjusting flexibility, reductions in adhesion temperature, adhesion to metal and the like; and antioxidants, ultraviolet absorbers, light stabilizers, and antiblocking agents for increasing thermal stability, light stability, processability and the like.

Softening agents are blended to improve flexibility of the modified hydrogenated block copolymer [E]. Examples of softening agents include low-molecular weight hydrocarbon polymers. Low-molecular weight hydrocarbon polymers capable of being uniformly dissolved or dispersed into the modified hydrogenated block copolymer [E] are preferable, and hydrocarbon polymers having a number-average molecular weight of 300 to 5,000 are preferable.

Specific examples of hydrocarbon polymers include low-molecular polymers such as polyisobutylene, polybutene, poly-4-methylpentene, poly-1-octene, and ethylene-α-olefin copolymers and hydrogenated products thereof; and low-molecular polymers such as polyisoprene, and polyisoprene/butadiene copolymers and hydrogenated products thereof. Softening agents may be used alone or in combination. Of these hydrocarbon polymers, preferred are hydrogenated products of low-molecular weight polyisobutylene and hydrogenated products of low-molecular weight polyisoprene particularly for their ability to maintain transparency and light resistance and to provide a modified hydrogenated block copolymer [E] that exhibits a superior softening effect. The blending amount of low-molecular weight hydrocarbon polymers is normally 20 parts by weight or less, preferably 10 parts by weigh or less, and more preferably 5 parts by weight or less, per 100 parts by weight of the modified hydrogenated block copolymer [E]. When the blending amount of low-molecular weight hydrocarbon polymers is increased, the flexibility of the interlayer films can be increased, but there is a tendency that heat resistance easily decreases or the amount of eluted materials easily increases.

Tackifiers are blended to confer tackiness to the modified hydrogenated block copolymer [E] to increase adhesion to metal. Examples of tackifiers include rosin resins; terpene resins; coumarone-indene resins; styrene resins; aliphatic, alicyclic or aromatic petroleum resins; and hydrogenated products thereof. These tackifiers can be used alone or in combination. The blending amount of tackifiers is normally 20 parts by weight or less, preferably 10 parts by weigh or less, and more preferably 5 parts by weight or less, per 100 parts by weight of the modified hydrogenated block copolymer [E]. When the blending amount of tackifiers is increased, the tackiness of the interlayer films can be increased, but there is a tendency that heat resistance easily decreases or the amount of eluted materials easily increases.

Antioxidants, ultraviolet absorbers, light stabilizer, antiblocking agents and other blending agents to be blended into the modified hydrogenated block copolymer [E] can be used alone or in combination. The blending amount of these blending agents is normally 10 parts by weight or less, preferably 5 parts by weigh or less, and more preferably 1 part by weight or less, per 100 parts by weight of the modified hydrogenated block copolymer [E].

Examples of antioxidants include phosphoric antioxidants, phenolic antioxidants, and sulfuric antioxidants.

Examples of phosphoric antioxidants include monophosphite compounds such as triphenyl phosphite, diphenylisodecyl phosphite, phenyldiisodecyl phosphite, tris(nonylphenyl) phosphite, tris(dinonylphenyl) phosphite, tris(2,4-di-t-butylphenyl) phosphite, and 10-(3,5-di-t-butyl-4-hydroxybenzyl)-9,10-dihydro-9-oxa-10-phosphaphenanthrene-10-oxide; and diphosphite compounds such as 4,4'-butylidene-bis(3-methyl-6-t-butyl-phenyl-di-tridecyl phosphite), 4,4'-isopropylidene-bis(phenyl-di-alkyl(C12-C15) phosphite).

Examples of phenolic antioxidants include acrylate compounds described in JPS63179953A and JPH01168643A, such as 2-t-butyl-6-(3-t-butyl-2-hydroxy-5-methylbenzyl)-4-methylphenyl acrylate, and 2,4-di-t-amyl-6-(1-(3,5-di-t-amyl-2-hydroxyphenyl)ethyl)phenyl acrylate; alkyl-substituted phenolic compounds such as octadecyl-3-(3,5-di-t-butyl-4-hydroxyphenyl)propionate, 2,2'-methylene-bis(4-methyl-6-t-butylphenol), 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis(methylene-3-(3',5'-di-t-butyl-4'-hydroxyphenylpropionate)methane[i.e., pentaerythrimethyl-tetrakis(3-(3,5-di-t-butyl-4-hydroxyphenylpropionate))], and triethylene glycol bis(3-(3-t-butyl-4-hydroxy-5-methylphenyl)propionate); and triazine group-containing phenolic compounds such as 6-(4-hydroxy-3,5-di-t-butylanilino)-2,4-bisoctylthio-1,3,5-triazine, 4-bisoctylthio-1,3-5-triazine, and 2-octylthio-4,6-bis-(3,5-di-t-butyl-4-oxyanilino)-1,3,5-triazine.

Examples of sulfuric antioxidants include dilauryl 3,3-thiodipropionate, dimyristyl 3,3'-thiodipropionate, distearyl 3,3-thiodipropionate, laurylstearyl 3,3-thiodipropionate, pentaerythritol-tetrakis(β-lauryl-thio-propionate), and 3,9-bis(2-dodecylthioethyl)-2,4,8,10-tetraoxaspiro[5.5]undecane.

Examples of ultraviolet absorbers include oxybenzophonone compounds, benzotriazole compounds, salicylic ester compounds, benzophenone compounds, benzotriazole compounds, acrylonitrile compounds, triazine compounds, nickel complex salts compounds, and inorganic powders.

Examples of light stabilizers include hindered amine light stabilizers such as 2,2,6,6-tetramethyl-4-piperidylbenzoate, bis(2,2,6,6-tetramethyl-4-piperidyl)sebacate, bis(1,2,2,6,6-pentamethyl-4-piperidyl)-2-(3,5-di-t-butyl-4-hydroxybenzyl)-2-n-butylmalonate, and 4-(3-(3,5-di-t-butyl-4-hydroxyphenyl)propionyloxy)-1-(2-(3-(3,5-di-t-butyl-4-hydroxyphenyl)propyonyl)oxy)ethyl)-2,2,6,6-tetramethylpyperidine.

Resin compositions containing the modified hydrogenated block copolymer [E] and blending agents can be produced by any of the methods known in the art. Examples include methods wherein the modified hydrogenated block copolymer [E] is molten using a twin-screw kneader, roll, Brabender, extruder or other device, blending agents are added, and kneaded; methods wherein the hydrogenated block copolymer [D] is molten using a twin-screw kneader, roll, Brabender, extruder or other device, kneaded with a low-molecular weight hydrocarbon polymer and/or tackifier, and thereafter, the hydrogenated block copolymer [D] is reacted with an ethylenically unsaturated silane compound in the presence of a peroxide to convert it into a modified hydrogenated block copolymer [E], and then blending agents are blended; and methods wherein blending agents are kneaded at the same time as when the hydrogenated block copolymer [D] is reacted with an ethylenically unsaturated silane compound in the presence of a peroxide.

2. First and Second Interlayer Films

The first and second interlayer films are sheets formed from the modified hydrogenated block copolymer [E] described above and are used for bonding together the first and second glass sheets. The first and second interlayer films may be the same or different so long as they are formed of the modified hydrogenated block copolymer [E].

The first and second interlayer films can be produced by any of the methods known in the art, such as melt extrusion, inflation, or calendering.

The first and second interlayer films are formed of the modified hydrogenated block copolymer [E] and are not required to be blended with organic peroxides or cross-linking aids for conferring thermal crosslinkability thus providing a broad choice of melt-forming temperatures. For example, when the first and second interlayer films are to be formed by melt extrusion, the resin temperature is appropriately selected from temperatures normally ranging from 170° C. to 230° C., preferably ranging from 180° C. to 220° C., and more preferably ranging from 190° C. to 210° C. When the resin temperature is too low, the resin flowability decreases so that the first and second interlayer films are more likely to have such problems as orange peel surface and/or die lines. Further, in this case, the extrusion rate of the first and second interlayer films cannot be raised, which is industrially disadvantageous. When the resin temperature is too high, it becomes more likely that troubles occur such as poor adhesion of the first and second interlayer films to glass sheets and/or reduced shelf stability of the first and second interlayer films resulting in reduced adhesion to glass after long-term storage in normal temperature, normal humidity environments.

The first and second interlayer films each may be of any thickness. The thickness of each of the first and second interlayer films is normally 0.1 mm to 5 mm, preferably 0.2 mm to 2 mm, and more preferably 0.3 mm to 1 mm. The first and second interlayer films may be of the same or different thickness. If the thickness of the first and second interlayer films is less than 0.1 mm, as will be described later, when first and second glass sheets are bonded together with a transparent film laminated with a heat reflection film—which transparent film has a smaller area than the glass sheets—interposed in between, a thickness difference occurs at the glass edge where the transparent film is not provided, resulting in concern that glass breaks. When the thickness of each of the first and second interlayer films is greater than 5 mm, there is concern that the light transmittance of the laminated glass as a whole decreases, or manufacture of the laminated glass becomes less economical due to the use of larger amounts of the modified hydrogenated block copolymer [E].

The first and second interlayer films each may be either a single-layer sheet made of a composition containing the modified hydrogenated block copolymer [E] optionally blended with the blending agents described above, or a multilayer sheet in which a layer made of the modified hydrogenated block copolymer [E] is laminated on one or both sides of a sheet made of a composition containing the hydrogenated block copolymer [D] optionally blended with the blending agents described above.

Examples of methods of forming such a multilayer sheet include two-kind three-layer co-extrusion; and methods wherein a sheet made of the modified hydrogenated block copolymer [E] is laminated on one or both sides of a sheet made of the hydrogenated block copolymer [D] by thermal press fitting.

When the first and second interlayer films are multilayer sheets, the layer made of the modified hydrogenated block copolymer [E] normally has a thickness of 0.005 mm or more, preferably 0.01 mm or more, and more preferably 0.015 mm or more. The upper limit of the thickness of the layer made of the modified hydrogenated block copolymer [E] is not particularly limited; the upper limit is normally less than 4.995 mm.

When the layer made of the modified hydrogenated block copolymer [E] has a thickness of less than 0.005 mm, it becomes difficult to provide sufficient adhesion to glass sheets.

The first and/or second interlayer film(s) can have a flat, embossed or other surface. The first and second interlayer films may be stored with a releasable film placed on one side of the first and/or second interlayer film(s) for the purpose of preventing blocking of the first and/or second interlayer films.

3. Transparent Film Laminated with Heat Reflection Film

The transparent film laminated with a heat reflection film used in this disclosure is a film having a light transmittance at 550 nm wavelength of 50% or more, preferably 60% or more, and more preferably 70% or more.

The above-described transparent film laminated with a heat reflection film is, for example, a film in which a heat reflection film (e.g., a laminate of alternating layers of metal oxide and metal, or a laminate of alternating layers of high and low refractive index layers of dielectric material made of metal oxide or the like) is laminated onto a base transparent resin film. The heat reflection film may have a layer having another function, e.g., a protection layer, formed on the surface, i.e., the side not in contact with the resin film.

Any resin film can be used so long as it is transparent (having light transmittance at 550 nm wavelength of 50% or more, preferably 60% or more, and more preferably 70% or more). For example, films made of synthetic resins such as: polyester resins such as polyethylene terephthalate and polyethylene naphthalate; acrylic resins such as polymethylmethacrylate; cycloolefin polymers; polycarbonates; polyether sulfones; polyarylates; and nylons can be used. Of these resin films, preferred are films made of polyester resins from the perspective of transparency, strength, economical efficiency and the like, with films made of polyethylene terephthalate being particularly preferable.

The resin film may be of any thickness. The thickness of the resin film is normally 10 μm to 300 μm, preferably 20 μm to 200 μm, and more preferably 40 μm to 100 μm.

Examples of films suitably used as the heat reflection film include metal films made of metals such as Au, Ag, Cu, Al, Pd, Pt, Sn, In, Zn, Ti, Cd, Fe, Co, Cr, and Ni; alloy films made of alloys of two or more of these metals; and multilayer films formed of a laminate of dielectric layers made of $TiO_2$, $Nb_2O_5$, $Ta_2O_5$, $SiO_2$, $Al_2O_3$, $ZrO_2$, $MgF_2$ and the like. Multilayer films formed of a laminate of dielectric films (infrared reflection films) are particularly preferable because they are permeable to electromagnetic waves and therefore are usable in vehicles such as automobiles without compromising the communication functions of communication devices inside the vehicle.

In this disclosure, as a transparent film laminated with a heat reflection film, it is also possible to use films generally commercially available as heat reflection films, heat barrier films, infrared reflection films, and infrared cut films.

4. Laminated Glass

The laminated glass disclosed herein includes at least a first glass sheet; a first interlayer film; a transparent film laminated with a heat reflection film; a second interlayer film; and a second glass sheet, which are laminated in the order presented, wherein the first and second interlayer films are formed of the modified hydrogenated block copolymer [E] described above. Specifically, in the laminated glass disclosed herein, the first glass sheet and transparent film laminated with a heat reflection film, and the transparent film laminated with a heat reflection film and second glass sheet are firmly joined to together using the modified hydrogenated block copolymer [E].

In the laminated glass disclosed herein, first and second glass sheets used may be made of the same or different materials, and may be provided with a transparent conductive film, an infrared reflection film, and/or the like.

Glass sheets used herein each may be of any thickness. The thickness of the glass sheet is normally on the order of 0.5 mm to 10 mm. Ultrathin glass sheets with a thickness of on the order of 0.05 mm to 0.4 mm can also be used. Glass sheets having different thicknesses can be used for example as in the following layer configuration: 5 mm thick reinforced glass sheet (first glass sheet)/first interlayer film/ transparent film laminated with a heat reflection film/second interlayer film/0.2 mm thick thin glass sheet (second glass sheet). Because the modified hydrogenated block copolymer [E] retains flexibility in a broad temperature range from as low as about −50° C. to as high as about +120° C., it is also possible to bond together glass sheets having different coefficients of thermal expansion and thus to reduce the likelihood of glass breakage due to rapid temperature changes.

Glass sheets used herein may be made of any material. Examples of materials of glass sheets include aluminosilicate glass, aluminoborosilicate glass, uranium glass, potash glass, silicate glass, crystallized glass, germanium glass, quarts glass, soda glass, lead glass, barium borosilicate glass, and borosilicate glass.

Manufacture of the laminated glass can be accomplished by methods wherein at least a first glass sheet, a first interlayer film, a transparent film laminated with a heat reflection film, a second interlayer film, and a second glass sheet are laminated in the order presented, and these components are bonded together using a vacuum laminator under heating and reduced pressure; methods wherein these components are placed in a vacuumable heat resistant rubber bag and, after degassing of the bag, bonded together using an autoclave under heating and pressure; and so forth.

The laminated glass disclosed herein is characterized by including interlayer films (first and second interlayer films) made of the modified hydrogenated block copolymer [E] that has small moisture absorbency and moisture permeability, and superior adhesion. Accordingly, even when used in high-temperature high-humidity environments, troubles such as clouding of the transparent film laminated with a heat reflection film, sandwiched between the first and second interlayer films, occur less frequently.

In order to more effectively reduce troubles of the laminated glass disclosed herein even when used in high-temperature high-humidity environments, it is preferable to take the following measures (a) to (e).

(a). Use a transparent film laminated with a heat reflection film, which has a smaller area than the first and second glass sheets. The laminated glass disclosed herein normally has a rectangular or square shape. In this case, the transparent film laminated with a heat reflection film is preferably smaller in size than the first and second glass sheets both in one direction and a direction perpendicular to that direction (longitudinal and lateral directions) of the first and second glass sheets. For example, when first and second glass sheets with a size of 300 mm×300 mm are used, a transparent film laminated with a heat reflection film, which has a size of 294 mm×294 mm, is used. The ratio of the area of the transparent film laminated with a heat reflection film to the area of the first and second glass sheet is preferably 90% to 100%, more preferably 95% to 100%, and still more preferably 95% to 99%.

(b). Use a transparent film laminated with a heat reflection film, which has a smaller area than the first and second interlayer films. The laminated glass disclosed herein normally has a rectangular or square shape. In this case, the transparent film laminated with a heat reflection film is preferably smaller in size than the first and second interlayer films both in one direction and a direction perpendicular to that direction (longitudinal and lateral directions) of the first and second interlayer films. For example, when first and second interlayer films with a size of 300 mm×300 mm are used, a transparent film laminated with a heat reflection film, which has a size of 194 mm×294 mm, is used. The ratio of the area of the transparent film laminated with a heat reflection film to the area of the first and second interlayer film is preferably 90% to 100%, more preferably 95% to 100%, and still more preferably 95% to 99%.

(c). The transparent film laminated with a heat reflection film is disposed such that the entire perimeter edge of the transparent film is set back 2 mm or more, preferably 2 mm to 10 mm, and more preferably 2 mm to 5 mm, from the edge of the first and second glass sheets.

For example, when first and second glass sheets with a size of 300 mm×300 mm are used, a transparent film laminated with a heat reflection film, which has a size of 294 mm×294 mm, is disposed at the center of the first and second glass sheets such that the edge is set back 3 mm from the edge of both the first and second glass sheets.

(d). The transparent film laminated with a heat reflection film is disposed such that the entire perimeter edge of the transparent film is set back 2 mm or more, preferably 2 mm to 10 mm, and more preferably 2 mm to 5 mm, from the edge of the first and second interlayer films.

For example, when first and second interlayer films with a size of 300 mm×300 mm are used, a transparent film laminated with a heat reflection film, which has a size of 294 mm×294 mm, is disposed at the center of the first and second interlayer films such that the edge is set back 3 mm from the edge of both the first and second interlayer films.

(e). The transparent film laminated with a heat reflection film is embedded into the first and second interlayer films. As used herein, "embedded" refers to a state in which the heat reflection film is buried into the first and second interlayer films without making contact with glass or outside air. In this case, the first and second interlayer films are also joined together at their edge.

(f). The first and second interlayer films are preferably of the same size as the first and second glass sheets from the perspective of adhesion strength.

The laminated glass disclosed herein may have a multilayer configuration such as the following: first glass sheet/first interlayer film/transparent film laminated with a heat reflection film/second interlayer film/display element/third interlayer film/second glass sheet; first glass sheet/first interlayer film/transparent film laminated with a heat reflection film/second interlayer film/dimming element/third interlayer film/second glass sheet; and so forth.

Display elements and dimming elements are composed of liquid crystal elements, thermochromic elements, photochromic elements, electrochromic elements or the like, and many of them are prone to degradation by moisture and oxygen penetrating from the edge of the laminated glass as are heat reflection films. Accordingly, configurations similar to that of the laminated glass disclosed herein, i.e., configurations in which the entire perimeter edge of the display element or dimming element is set back 2 mm or more from the edge of the first and second interlayer films (e.g., first glass sheet/first interlayer film/display element/second interlayer film/second glass sheet; and first glass sheet/first interlayer film/dimming element/second interlayer film/second glass sheet) are effective also for preventing degradation of display elements and dimming elements in high-temperature high-humidity environments.

The laminated glass disclosed herein is useful as window glass for buildings, roof glass, heat barrier materials for rooms, windshield glass and sunroof glass for automobiles, and window glass for rail vehicles and ships.

EXAMPLES

The following provides detailed description of this disclosure based on Examples, which however shall not be construed as being limiting in scope. Unless otherwise indicated, "part(s)" and "%" are weight basis.

In Examples, various properties are evaluated by the methods described below.

(1) Weight-Average Molecular Weight (Mw) and Molecular Weight Distribution (Mw/Mn)

The molecular weights of block copolymers and hydrogenated block copolymers were measured at 38° C. by GPC using THF as eluent, in terms of standard polystyrene equivalent.

HLC-8020 GPC (Tosoh Corporation) was used as a measurement device.

(2) Percent Hydrogenation

The percent hydrogenation of the main chain, side chains and aromatic rings of the hydrogenated block copolymer [D] was calculated by measuring a $^1$H-NMR spectrum.

(3) Light Transmittance

Light transmittance at 550 nm and 2,500 nm wavelengths was measured using an ultraviolet-visible spectrometer (mode V-670, JASCO Corporation).

(4) Moisture Resistance

Test specimens of flat laminated glass (size: 300 m×300 mm) were essentially horizontally placed into a thermostat chamber (50° C., 95% RH) and stored for 336 hours. Appearance changes were then visually evaluated.

Test specimens confirmed to show no appearance changes such as cracking, swelling, peeling, coloring, foaming or clouding were ranked "A (good)"; test specimens without cracking, swelling and peeling but showed coloring, foaming or clouding only within 10 mm from the edge of the test specimen were ranked "B (acceptable)"; and test specimens with cracking, swelling or peeling and showing any of coloring, foaming and clouding beyond 10 mm from the edge of the test specimen were ranked "C (poor)."

(5) Heat Resistance

Test specimens of flat laminated glass (size: 300 mm×300 mm) were placed upright in boiling water and retained for 2 hours. Appearance changes were then visually evaluated.

Test specimens confirmed to have no cracking, foaming and other defects were ranked "A (good)"; test specimens without cracking but showed foaming or other defects only within 10 mm from the edge of the test specimen were ranked "B (acceptable)"; and test specimens with cracking and showing any of foaming and other defects beyond 10 mm from the edge of the test specimen were ranked "C (poor)."

Reference Example 1

Manufacture of Interlayer Film [F1]

Production of Block Copolymer [C1]

A fully nitrogen-purged reactor equipped with a stirrer was charged with 550 parts of dehydrated cyclohexane, 25.0 parts of dehydrated styrene and 0.475 parts of di-n-butyl ether. Under stirring at 60° C., 0.88 parts of n-butyllithium in cyclohexane (15% solution) was added to initiate polymerization. The reaction mass was stirred for another 60 minutes at 60° C. At this point, the reaction solution was subjected to gas chromatography, and the polymerization conversion rate was 99.5%.

Thereafter, 50.0 parts of dehydrated isoprene was added to the reaction solution and stirred for 30 minutes at 60° C. The polymerization conversion rate at this point was confirmed to be 99.5%.

Further, 25.0 parts of dehydrated styrene was added to the reaction solution and stirred for 60 minutes at 60° C. The polymerization conversion rate at this point was almost 100%.

The reaction was quenched by the addition of 0.5 parts of isopropyl alcohol to the reaction solution to afford a polymer solution. The resultant block copolymer [C1] had a weight-average molecular weight (Mw) of 47,200, a molecular weight distribution (Mw/Mn) of 1.04, and a wA:wB of 50:50.

Production of Hydrogenated Block Copolymer [D1]

The polymer solution prepared above was transferred to a pressure-resistant reactor equipped with a stirrer, and 8.0 parts of nickel catalyst supported on diatomaceous earth carrier ("E22U", JGC Catalysts and Chemicals Ltd., 60% nickel) as a hydrogenation catalyst and 100 parts of dehydrated cyclohexane were added and mixed. The reactor was purged with hydrogen gas and hydrogen was fed to the reactor while stirring the solution to effect a hydrogenation reaction at 190° C. for 6 hours under a pressure of 4.5 MPa. The resultant hydrogenated block copolymer [D1] had a weight-average molecular weight (Mw) of 49,900 and a molecular weight distribution (Mw/Mn) of 1.06.

After completion of the hydrogenation reaction, the reaction solution was filtered to remove the hydrogenation catalyst. 1.0 part of a solution prepared by dissolving 0.1 parts of a phenolic antioxidant pentaerythrityl-tetrakis[3-(3, 5-di-t-butyl-4-hydroxyphenyl)propionate] ("Songnox1010", KOYO Chemical Research Center) in xylene was added to the filtrate.

The solution prepared above was then filtered through a metal fiber filter (pore size: 0.4 μm, Nichidai Corporation) to remove fine solids. The solvent (cyclohexane and xylene) and other volatile components were removed from the solution at 260° C. under a pressure of 0.001 MPa or less using a cylindrical evaporator ("Kontro", Hitachi Ltd.). Subsequently, a molten polymer was filtered at 260° C. through a polymer filter equipped with a 5 μm pore stainless steel sintered filter (Fuji Filter Mfg., Co Ltd.) connected to the evaporator, extruded from the die into a strand, cooled, and pelletized using a pelletizer to afford 95 parts of pellets of the hydrogenated block copolymer [D1]. The resultant pellet of the hydrogenated block copolymer [D1] had a weight-average molecular weight (Mw) of 49,500, a molecular weight distribution (Mw/Mn) of 1.10, and a percent hydrogenation of almost 100%.

Production of Modified Hydrogenated Block Copolymer [E1]

To 100 parts of pellets of the hydrogenated block copolymer [D1] were added 2.0 parts of vinyltrimethoxysilane and 0.2 parts of 2,5-dimethyl-2,5-di(t-butylperoxy)hexane ("PERHEXA (registered trademark in Japan, other countries, or both) 25B", NOF Corporation) to afford a mixture. The mixture was kneaded at a resin temperature of 200° C. for a residence time of 60 seconds to 70 seconds using a twin-screw extruder, extruded into a strand, air-cooled, and pelletized using a pelletizer to afford 94 parts of pellets of an alkoxysilyl group-containing modified hydrogenated block copolymer [E1].

10 parts of the resultant pellet of the modified hydrogenated block copolymer [E1] was dissolved into 100 parts of cyclohexane, and the resultant solution was poured into 400 parts of dehydrated methanol to coagulate the modified hydrogenated block copolymer [E1], which was filtered off and dried at 25° C. under vacuum to isolate 9.0 parts of a crumb of the modified hydrogenated block copolymer [E1].

An FT-IR spectrum of the isolated crumb was measured. The spectrum showed a new absorption band assigned to the Si—OCH$_3$ group at 1,090 cm$^{-1}$, and new absorption bands assigned to the Si—CH$_2$ group at 825 cm$^{-1}$ and 739 cm$^{-1}$. These new absorption bands were observed at different positions from those assigned to the Si—OCH$_3$ group and Si—CH$_2$ group of vinyltrimethoxysilane at 1,075 cm$^{-1}$, 808 cm$^{-1}$ and 766 cm$^{-1}$. Further, a peak assigned to the proton of the methoxy group was observed at 3.6 ppm in a $^1$H-NMR spectrum (measured in deuterated chloroform). It was confirmed from the peak area ratio that 1.8 parts of vinyltrimethoxysilane was bonded per 100 parts of the hydrogenated block copolymer [D1].

Manufacture of Interlayer Film [F1] Formed of Modified Hydrogenated Block Copolymer [E1]

Using an extrusion sheet forming machine equipped with: a T-die film melt extrusion forming machine (T-die width: 600 mm) having an extruder equipped with a 40 mm diameter screw; a cast roll (with embossed pattern); and a sheet take-up machine, pellets of the modified hydrogenated block copolymer [E1] were extruded at a molten resin temperature of 200° C., a T-die temperature of 200° C. and a cast roll temperature of 60° C. into a sheet to afford an interlayer film [F1] (380 μm thick, 500 mm width) formed of the modified hydrogenated block copolymer [E1]. The resultant interlayer film [F1] was wound around a roll for recovery.

Reference Example 2

Manufacture of Interlayer Film [F2]

Production of Block Copolymer [C2]

A polymerization reaction was performed as in Reference Example 1 except that 20.0 parts of styrene, 60.0 parts of isoprene, and 20.0 parts of styrene were added sequentially in separate 3 steps and 0.80 parts of n-butyllithium in cyclohexane (15% solution) was used. The polymerization reaction was then quenched to afford a polymer solution. The resultant block copolymer [C2] had a weight-average molecular weight (Mw) of 51,200, a molecular weight distribution (Mw/Mn) of 1.04, and a wA:wB of 40:60.

Production of Hydrogenated Block Copolymer [D2]

Next, a hydrogenation reaction was performed as in Reference Example 1 using the polymer solution prepared above. The hydrogenated block copolymer [D2] had a weight-average molecular weight (Mw) of 54,200, and a molecular weight distribution (Mw/Mn) of 1.06.

After completion of the hydrogenation reaction, as in Reference Example 1, an antioxidant was added and then the reaction solution was condensed to dryness to afford 94 parts of pellets of the hydrogenated block copolymer [D2]. The resultant pellet of the hydrogenated block copolymer [D2] had a weight-average molecular weight (Mw) of 53,600, a molecular weight distribution (Mw/Mn) of 1.11, and a percent hydrogenation of almost 100%.

Production of Modified Hydrogenated Block Copolymer [E2]

As in Reference Example 1, using the resultant pellet of the hydrogenated block copolymer [D2], 96 parts of pellets of an alkoxysilyl group-containing modified hydrogenated block copolymer [E2] was obtained.

Analyzing the resultant modified hydrogenated block copolymer [E2] as in Reference Example 1, it was confirmed that 1.8 parts of vinyltrimethoxysilane was bonded to 100 parts of the hydrogenated block copolymer [D2].

Manufacture of Interlayer Film [F2] Formed of Modified Hydrogenated Block Copolymer [E2]

Pellets of the modified hydrogenated block copolymer [E2] were formed into sheet as in Reference Example 1 to manufacture an interlayer film [F2] (380 μm thick, 500 mm width) formed of the modified hydrogenated block copolymer [E2].

Reference Example 3

Manufacture of Interlayer Film [F3]

Production of Block Copolymer [C3]

A polymerization reaction was performed as in Reference Example 1 except that 15.0 parts of styrene, 75.0 parts of isoprene, and 10.0 parts of styrene were added sequentially in separate 3 steps and 0.61 parts of n-butyllithium in cyclohexane (15% solution) was used. The polymerization reaction was then quenched to afford a polymer solution.

The resultant block copolymer [C3] had a weight-average molecular weight (Mw) of 65,700, a molecular weight distribution (Mw/Mn) of 1.04, and a wA:wB of 25:75.

Production of Hydrogenated Block Copolymer [D3]

Next, a hydrogenation reaction was performed as in Reference Example 1 using the polymer solution prepared above. The hydrogenated block copolymer [D3] had a weight-average molecular weight (Mw) of 69,500 and a molecular weight distribution (Mw/Mn) of 1.05.

After completion of the hydrogenation reaction, as in Reference Example 1, an antioxidant was added and then the reaction solution was condensed to dryness to afford 87 parts of pellets of the hydrogenated block copolymer [D3]. The resultant pellet of the hydrogenated block copolymer [D3] had a weight-average molecular weight (Mw) of 68,800, a molecular weight distribution (Mw/Mn) of 1.09, and a percent hydrogenation of almost 100%.

Production of Modified Hydrogenated Block Copolymer [E3]

As in Reference Example 1, using the resultant pellet of the hydrogenated block copolymer [D3], 74 parts of pellets of an alkoxysilyl group-containing modified hydrogenated block copolymer [E3] was obtained.

Analyzing the resultant modified hydrogenated block copolymer [E3] as in Reference Example 1, it was confirmed that 1.9 parts of vinyltrimethoxysilane was bonded to 100 parts of the hydrogenated block copolymer [D3].

Manufacture of Interlayer Film [F3] Formed of Modified Hydrogenated Block Copolymer [E3]

An interlayer film [F3] (380 μm thick, 500 mm width) formed of the modified hydrogenated block copolymer [E3] was manufactured as in Reference Example 1 except that pellets of the modified hydrogenated block copolymer [E3] were used, the molten resin temperature was set to 150° C., the T-die temperature was set to 150° C., the cast roll temperature was set to 30° C., and the modified hydrogenated block copolymer [E3] was extruded onto a 25 μm thick releasable polyethylene terephthalate film (hereinafter "PET film") while feeding the PET film onto the cast roll. The resultant interlayer film [F3] was wound around a roll together with the PET film for recovery.

Reference Example 4

Manufacture of Interlayer Film [F4]

Production of Block Copolymer [C4]

A polymerization reaction was performed as in Reference Example 1 except that 35.0 parts of styrene, 30.0 parts of isoprene, and 35.0 parts of styrene were added sequentially in separate 3 steps and 0.61 parts of n-butyllithium in cyclohexane (15% solution) was used. The polymerization reaction was then quenched to afford a polymer solution. The resultant block copolymer [C4] had a weight-average molecular weight (Mw) of 70,000, a molecular weight distribution (Mw/Mn) of 1.04, and a wA:wB of 70:30.

Production of Hydrogenated Block Copolymer [D4]

Next, a hydrogenation reaction was performed as in Reference Example 1 using the polymer solution prepared above. The hydrogenated block copolymer [D4] had a weight-average molecular weight (Mw) of 74,100 and a molecular weight distribution (Mw/Mn) of 1.05.

After completion of the hydrogenation reaction, as in Reference Example 1, an antioxidant was added and then the reaction solution was condensed to dryness to afford 97 parts of pellets of the hydrogenated block copolymer [D4]. The resultant pellet of the hydrogenated block copolymer [D4] had a weight-average molecular weight (Mw) of 73,400, a molecular weight distribution (Mw/Mn) of 1.11, and a percent hydrogenation of almost 100%.

Production of Modified Hydrogenated Block Copolymer [E4]

As in Reference Example 1, using the resultant pellet of the hydrogenated block copolymer [D4], 91 parts of pellets of an alkoxysilyl group-containing modified hydrogenated block copolymer [E4] was obtained.

Analyzing the resultant modified hydrogenated block copolymer [E4] as in Reference Example 1, it was confirmed that 1.4 parts of vinyltrimethoxysilane was bonded per 100 parts of the hydrogenated block copolymer [D4].

Manufacture of Interlayer Film [F4] Formed of Modified Hydrogenated Block Copolymer [E4]

An interlayer film [F4] (380 μm thick, 500 mm width) formed of the modified hydrogenated block copolymer [E4] was manufactured as in Reference Example 1 except that pellets of the modified hydrogenated block copolymer [E4] were used, the molten resin temperature was set to 220° C., the T-die temperature was set to 220° C., and the cast roll temperature was set to 70° C.

Reference Examples 5

Manufacture of Interlayer Film [F5]

Production of Composition [E5] Containing Modified Hydrogenated Block Copolymer [E1] as Main Component Pellets of the modified hydrogenated block copolymer [E1] obtained in Reference Example 1 were extruded at a resin temperature of 190° C. using a twin-screw extruder equipped with a side feeder capable of feeding liquid materials ("TEM37BS", Toshiba Machine Co., Ltd.). On the other hand, a hydrogenated isobutene polymer ("PARLEAM (registered trademark in Japan, other countries, or both) 24", NOF Corporation) was continuously fed from the side feeder in an amount of 10 parts per 100 parts of the modified hydrogenated block copolymer [E1], and the mixture was extruded into a strand, air-cooled, and pelletized using a pelletizer to afford 105 parts of pellets of a modified hydrogenated block copolymer resin composition [E5] in which the modified hydrogenated block copolymer [E1] is blended with the hydrogenated isobutene polymer.

Manufacture of Interlayer Film [F5] Formed of Modified Hydrogenated Block Copolymer Resin Composition [E5]

An interlayer film [F5] (760 μm thick, 500 mm width) formed of the modified hydrogenated block copolymer resin composition [E5] was manufactured as in Reference Example 1 except that pellets of the modified hydrogenated block copolymer resin composition [E5] were used.

Reference Example 6

Manufacture of Transparent Film [G1] Laminated with Heat Reflection Film

A heat reflection film made of $In_2O_3$ (30 nm)/Ag (10 nm)/$In_2O_3$ (60 nm)/Ag (10 nm)/$In_2O_3$ (30 nm) was deposited onto one side of a 40 cm×40 cm polyethylene terephthalate film ("Lumirror", Toray Industries, Inc.; 50 thick) by DC magnetron sputtering to manufacture a film [G1] for heat reflection. The film [G1] had a light transmittance at 550 nm wavelength of 78% and a light transmittance at 2,500 nm wavelength of 4%.

Example 1

300 mm×300 mm test specimens were cut from the interlayer film [F1] manufactured in Reference Example 1 and from the transparent film [G1] laminated with a heat reflection film manufactured in Reference Example 6.

Next, the test specimens of the interlayer film [F1] and transparent film [G1] were overlaid between two sheets of soda lime glass (3.0 mm thick, 300 mm×300 mm size) so as to have the layer configuration: first glass sheet/first interlayer film [F1]/film [G1]/second interlayer film [F1]/second glass sheet. The laminate was placed into a rubber bag, and the bag was degassed, sealed air-tight, and placed into an autoclave, where the laminate was processed at 140° C. for 30 minutes under a pressure of 0.8 MPa to manufacture a laminated glass test specimen [H1]-1. In the test specimen [H1]-1, the edge of the film [G1] is not embedded by the interlayer film [F1].

In a similar manner, a 70 mm×50 mm laminated glass test specimen [H1]-2 was manufactured for measurement of light transmittance.

The laminated glass test specimen [H1]-2 had a light transmittance at 550 nm wavelength of 75% and a light transmittance at 2,500 nm wavelength of 4%.

The laminated glass test specimen [H1]-1 only showed clouding in a region within 5 mm from the edge of the laminated glass after retention at 50° C. and 95% RH, and rated "B (acceptable)" in the evaluation of moisture resistance.

The laminated glass test specimen [H1]-1 showed no changes in appearance after retention in boiling water, and rated "A (good)" in the evaluation of heat resistance.

Example 2

A laminated glass test specimen [H2] having the layer configuration: first glass sheet/first interlayer film [F1]/film [G1]/second interlayer film [F1]/second glass sheet was manufactured as in Example 1 except that a 294 mm×294 mm test specimen was cut from the transparent film [G1] laminated with a heat reflection film manufactured in Reference Example 6, and the test specimen was disposed at the center of the interlayer film [F1] sheet such that the edge of the test specimen is set back 3 mm from the edge of the interlayer film [F1] sheet both in longitudinal and lateral directions. The test specimen [H2] has a 3 mm width region free of the film [G1] along the perimeter of the laminated glass, with the edge of the film [G1] being embedded by the first and second interlayer films [F1].

The laminated glass test specimen [H2] showed no clouding and other changes over the entire surface of the laminated glass, and rated "A (good)" in the evaluation of moisture resistance.

The laminated glass [H2] showed no appearance changes and rated "A (good)" in the evaluation of heat resistance.

Example 3

A laminated glass test specimen [H3]-1 having the layer configuration: first glass sheet/first interlayer film [F2]/film [G1]/second interlayer film [F2]/second glass sheet was manufactured as in Example 1 except that the interlayer film [F2] manufactured in Reference Example 2 was used. In the test specimen [H3-1], the edge of the film [G1] is not embedded by the first and second interlayer films [F2]. In a similar manner, a 70 mm×50 mm laminated glass test specimen [H3]-2 for measurement of light transmittance was manufactured.

The laminated glass test specimen [H3]-2 had a light transmittance at 550 nm wavelength of 75% and a light transmittance at 2,500 nm wavelength of 4%.

The laminated glass test specimen [H3]-1 only showed clouding in a region within 2 mm from the edge of the laminated glass and rated "B (acceptable)" in the evaluation of moisture resistance.

The laminated glass [H3]-1 showed no appearance changes and rated "A (good)" in the evaluation of heat resistance.

Example 4

A laminated glass test specimen [H4] having the layer configuration: first glass sheet/first interlayer film [F2]/film [G1]/second interlayer film [F2]/second glass sheet was manufactured as in Example 2 except that the interlayer film [F2] manufactured in Reference Example 2 was used. The test specimen [H4] has a 3 mm width region free of the film [G1] along the perimeter of the laminated glass, with the edge of the film [G1] being embedded by the first and second interlayer films [F2].

The laminated glass test specimen [H4] showed no clouding and other changes over the entire surface of the laminated glass, and rated "A (good)" in the evaluation of moisture resistance.

The laminated glass [H4] showed no appearance changes and rated "A (good)" in the evaluation of heat resistance.

Example 5

A laminated glass test specimen [H5]-1 having the layer configuration: first glass sheet/first interlayer film [F5]/film [G1]/second interlayer film [F5]/second glass sheet was manufactured as in Example 1 except that the interlayer film [F5] manufactured in Reference Example 5 was used and a 3.0 mm thick, 300 mm×300 mm white glass sheet was used instead of soda lime glass (first and second glass sheets). In the test specimen [H5]-1, the edge of the film [G1] is not embedded by the first and second interlayer films [F5].

In a similar manner, a 70 mm×50 mm laminated glass test specimen [H5]-2 for measurement of light transmittance was manufactured using a 3.0 mm thick white glass sheet.

The laminated glass test specimen [H5]-2 had a light transmittance at 550 nm wavelength of 75% and a light transmittance at 2,500 nm wavelength of 4%.

The laminated glass test specimen [H5]-1 only showed slight clouding only in a region within 1 mm from the edge of the laminated glass and rated "B (acceptable)" in the evaluation of moisture resistance.

The laminated glass [H5]-1 showed no appearance changes and rated "A (good)" in the evaluation of heat resistance.

Comparative Example 1

A laminated glass test specimen [H6]-1 having the layer configuration: first glass sheet/first interlayer film [F3]/film [G1]/second interlayer film [F3]/second glass sheet was manufactured as in Example 1 except that the interlayer film [F3] manufactured in Reference Example 3, from which the PET film had been removed, was used and the autoclave temperature was set to 110° C. In the test specimen [H6-1], the edge of the film [G1] is not embedded by the first and second interlayer films [F3].

In a similar manner, a laminated glass test specimen [H6]-2 for measurement of light transmittance was manufactured using a 3.0 mm thick white glass sheet.

The laminated glass test specimen [H6]-2 had a light transmittance at 550 nm wavelength of 75% and a light transmittance at 2,500 nm wavelength of 4%.

The laminated glass test specimen [H6]-1 showed no clouding and other changes over the entire surface of the laminated glass, and rated "A (good)" in the evaluation of moisture resistance.

In the laminated glass test specimen [H6]-1, the bonded two glass sheets were displaced from each other by about 1 mm, and rated "C (poor)" in the evaluation of heat resistance.

Comparative Example 2

A laminated glass test specimen [H7]-1 having the layer configuration: first glass sheet/first interlayer film [F4]/film [G1]/second interlayer film [F4]/second glass sheet was manufactured as in Example 2 except that the interlayer film [F4] manufactured in Reference Example 4 was used and the autoclave temperature was set to 150° C. In the test specimen [H7]-1, the edge of the film [G1] is embedded by the first and second interlayer films [F4].

In a similar manner, a laminated glass test specimen [H7]-2 for measurement of light transmittance was manufactured using a 3.0 mm thick white glass sheet.

The laminated glass test specimen [H7]-2 had a light transmittance at 550 nm wavelength of 75% and a light transmittance at 2,500 nm wavelength of 4%.

The laminated glass test specimen [H7]-1 showed clouding inwardly expanding beyond 10 mm from the edge of the laminated glass test specimen [H7]-1, and rated "C (poor)" in the evaluation of moisture resistance.

The laminated glass test specimen [H7]-1 showed clouding inwardly expanding beyond 10 mm from the edge of the laminated glass test specimen [H7]-1 and rated "C (poor)" also in the evaluation of heat resistance.

Reference Example 7

Manufacture of Interlayer Film [F7]

Interlayer Film [F7] Containing Ethylene-Vinyl Acetate Copolymer as Main Component To 95 parts of pellets of an ethylene-vinyl acetate copolymer (hereinafter "EVA") ("EVAFLEX" (registered trademark in Japan, other countries, or both), DuPont-Mitsui Polychemicals Co., Ltd.; vinyl acetate content: 33% by weight) were added 7 parts of triallylisocyanurate, 0.5 parts of 3-methacryloxypropyltrimethoxysilane ("KBM-503", Shin-Etsu Chemicals, Co., Ltd.), 1.0 part of dicumyl peroxide ("PERCUMYL D", NOF Corporation), and 0.4 parts of 2-(2H-benzotriazole-2-yl)-4-(1,1,3,3-tetramethylbutyl)phenol, and mixed.

Using the T-dye film forming machine and film take-up machine used in Reference Example 1, the mixture was extruded into a sheet at a molten resin temperature of 90° C., a T-die temperature of 90° C. and an emboss roll temperature of 50° C. with an emboss roll pressed against one side of the extruded sheet using a touch roll to form an emboss pattern thereon. In this way interlayer film [F7] (380 μm thick, 500 mm width) made of EVA was manufactured. The resultant interlayer film [F7] was wound around a roll for recovery.

Comparative Example 3

A 300 mm×300 mm test specimen was cut from the interlayer film [F7] manufactured in Reference Example [7] which contains EVA as the main component, and a 294 mm×294 mm test specimen was cut from the transparent film [G1] laminated with a heat reflection film manufactured in Reference Example 6. The test specimens of the interlayer film [F7] and transparent film [G1] were overlaid between two sheets of soda lime glass (3.0 mm thick, 300 mm×300 mm; first and second glass sheets) so as to have the layer configuration: first glass sheet/first interlayer film [F7]/film [G1]/second interlayer film [F7]/second glass sheet.

Using a vacuum laminator ("PVL0505S", Nisshinbo Mechatronics Inc.), the laminate was pre-heated at 150° C. for 10 minutes under vacuum and then pressed at 150° C. for 30 minutes under a pressure of 0.03 MPa to manufacture laminated glass. The laminated glass was placed into an autoclave and further processed at 140° C. for 30 minutes under a pressure of 0.8 MPa to manufacture a laminated glass test specimen [H8]. The laminated glass test specimen [H8] has a 3 mm width region free of the film [G1] along the perimeter of the laminated glass, with the edge of the film [G1] being embedded by the first and second interlayer films [F7].

The laminated glass test specimen [H8] showed clouding inwardly expanding beyond 10 mm from the edge of the laminated glass test specimen [H8] and rated "C (poor)" in the evaluation of moisture resistance.

The laminated glass test specimen [H8] showed clouding inwardly expanding beyond 10 mm from the edge of the laminated glass test specimen [H8] and rated "C (poor)" also in the evaluation of moisture resistance.

The results of Examples and Comparative Examples reveal the following facts.

The laminated glasses that include, in order, a first glass sheet, a first interlayer film, a transparent film laminated with a heat reflection film, a second interlayer film and a second glass sheet wherein the interlayer film [F] formed of the specific modified hydrogenated block copolymer [E] disclosed herein is used show a good infrared light reflection function as well as superior moisture resistance and heat resistance (Examples 1 to 5).

The laminated glasses wherein the edge of the transparent film laminated with a heat reflection film is embedded by the interlayer films [F] formed of the specific modified hydrogenated block copolymer [E] show better moisture resistance without causing clouding at the edge of the transparent film even in the moisture resistance test (Examples 2 and 4).

Also in the case of the modified hydrogenated block copolymer [E], when the amount of the polymer block [A] which includes a repeat unit derived from an aromatic vinyl compound as the main component is too small, the laminated glass shows good moisture resistance but insufficient heat resistance (Comparative Example 1).

Also in the case of the modified hydrogenated block copolymer [E], when the amount of the polymer block [A] which includes a repeat unit derived from an aromatic vinyl compound as the main component is too large, the laminated glass shows good heat resistance, but insufficient moisture resistance and boiling water resistance even when the edge of the transparent film laminated with a heat reflection film is embedded (Comparative Example 2).

In the case of the interlayer film made of EVA, which has a polar group, the laminated glass shows insufficient moisture resistance and boiling water resistance even when the edge of the transparent film laminated with a heat reflection film is embedded (Comparative Example 3).

INDUSTRIAL APPLICABILITY

The laminated glass disclosed herein which has a heat reflection function has superior moisture resistance and heat resistance and is therefore highly useful in practical applications.

According to this disclosure, with the use of interlayer films made of the specific modified hydrogenated block copolymer [E], it is possible to manufacture laminated glass wherein a transparent film laminated with a heat reflection film which is superior in mass production is sandwiched between glass sheets.

The invention claimed is:

1. A laminated glass comprising, in order:
a first glass sheet;
a first interlayer film;
a transparent film laminated with a heat reflection film;
a second interlayer film; and
a second glass sheet, wherein
the first interlayer film and the second interlayer film are both formed of a modified hydrogenated block copolymer [E],
the modified hydrogenated block copolymer [E] is a hydrogenated block copolymer [D] in which an alkoxysilyl group is incorporated, the hydrogenated block copolymer [D] being a block copolymer [C] in which 90% or more of all unsaturated bonds are hydrogenated,
the block copolymer [C] is composed of at least two polymer blocks [A] and at least one polymer block [B], the polymer blocks [A] each including a repeat unit derived from an aromatic vinyl compound as a main component, and the polymer block [B] including a repeat unit derived from a linear conjugated diene compound as a main component,
a wA-to-wB ratio (wA:wB) is 30:70 to 60:40, where wA is a weight fraction of all the polymer blocks [A] of the block copolymer, and wB is a weight fraction of all the polymer blocks [B] of the block copolymer,
the transparent film laminated with the heat reflection film has a smaller area than the first and second glass sheets, and
an entire perimeter edge of the transparent film laminated with the heat reflection film is set back 2 mm or more and 10 mm or less from an edge of the first and second glass sheets.

2. A laminated glass comprising, in order:
a first glass sheet;
a first interlayer film;
a transparent film laminated with a heat reflection film;
a second interlayer film; and
a second glass sheet, wherein
the first interlayer film and the second interlayer film are both formed of a modified hydrogenated block copolymer [E],
the modified hydrogenated block copolymer [E] is a hydrogenated block copolymer [D] in which an alkoxysilyl group is incorporated, the hydrogenated block copolymer [D] being a block copolymer [C] in which 90% or more of all unsaturated bonds are hydrogenated,
the block copolymer [C] is composed of at least two polymer blocks [A] and at least one polymer block [B], the polymer blocks [A] each including a repeat unit derived from an aromatic vinyl compound as a main component, and the polymer block [B] including a repeat unit derived from a linear conjugated diene compound as a main component,
a wA-to-wB ratio (wA:wB) is 30:70 to 60:40, where wA is a weight fraction of all the polymer blocks [A] of the block copolymer, and wB is a weight fraction of all the polymer blocks [B] of the block copolymer,
a. the transparent film laminated with the heat reflection film has a smaller area than the first and second glass sheets,
b. the transparent film laminated with the heat reflection film has a smaller area than the first and second interlayer films,
c. an entire perimeter edge of the transparent film laminated with the heat reflection film is set back 2 mm or more and 10 mm or less from an edge of the first and second glass sheets,
d. the entire perimeter edge of the transparent film laminated with the heat reflection film is set back 2 mm or more and 10 mm or less from an edge of the first and second interlayer films, and
e. the transparent film laminated with the heat reflection film is embedded by the first and second interlayer films.

* * * * *